(12) United States Patent
Kamikawa (10) Patent No.: US 8,944,078 B2
(45) Date of Patent: Feb. 3, 2015

(54) SUBSTRATE PROCESSING APPARATUS, SUBSTRATE PROCESSING METHOD AND STORAGE MEDIUM

(75) Inventor: Yuji Kamikawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 557 days.

(21) Appl. No.: 13/078,308

(22) Filed: Apr. 1, 2011

(65) Prior Publication Data

US 2011/0240066 A1  Oct. 6, 2011

(30) Foreign Application Priority Data

Apr. 5, 2010  (JP) ................................ 2010-087248

(51) Int. Cl.
*H01L 21/67* (2006.01)

(52) U.S. Cl.
CPC .... *H01L 21/67057* (2013.01); *H01L 21/67034* (2013.01); *Y10S 134/902* (2013.01)
USPC ......................................... 134/95.2; 134/902

(58) Field of Classification Search
CPC ................... H01L 21/67034; H01L 21/67057; H01L 21/67126; H01L 21/67757; Y10S 134/902; B01J 3/008; B01J 3/06
USPC .................... 134/95.2, 902; 34/337
See application file for complete search history.

(56) References Cited

U.S. PATENT DOCUMENTS

| 5,494,526 A | * | 2/1996 | Paranjpe | ........................... 134/1 |
| 6,334,266 B1 | * | 1/2002 | Moritz et al. | ................... 34/337 |
| 6,880,560 B2 | * | 4/2005 | Ching et al. | ................... 134/1.3 |

FOREIGN PATENT DOCUMENTS

| JP | 2006-066698 A | 3/2006 |
| JP | 2008-72118 A | 3/2008 |
| JP | 2010-074140 A | 4/2010 |

* cited by examiner

*Primary Examiner* — Michael Kornakov
*Assistant Examiner* — Douglas Lee
(74) *Attorney, Agent, or Firm* — Abelman, Frayne & Schwab (57) ABSTRACT

Disclosed is a substrate processing apparatus capable of drying a substrate to be processed while suppressing a pattern collapse or occurrence of contamination. In a processing vessel, a substrate is immersed in a liquid in the longitudinal direction, and the liquid is pushed out by a substitution fluid of a supercritical state to be discharged from the processing vessel. Thereafter, the substitution fluid subjected to the substitution with the liquid is discharged from the processing vessel to depressurize the processing vessel, and the substitution fluid is changed from the supercritical state to a gaseous state to dry the substrate.

2 Claims, 11 Drawing Sheets

SUPERCRITICAL PROCESSING APPARATUS

SUBSTRATE PROCESSING APPARATUS, SUBSTRATE PROCESSING METHOD AND STORAGE MEDIUM

CROSS-REFERENCE TO RELATED APPLICATIONS

This application is based on and claims priority from Japanese Patent Application No. 2010-087248, filed on Apr. 5, 2010, with the Japanese Patent Office, the disclosure of which is incorporated herein in its entirety by reference.

TECHNICAL FIELD

The present disclosure relates to a technology that dries a substrate to be processed which is subjected to a process such as washing by using a supercritical fluid.

BACKGROUND

A process of manufacturing a semiconductor device in which a stacking structure of an integrated circuit is formed on the surface of a substrate to be processed, such as a semiconductor wafer (hereinafter, referred to as a wafer) includes a liquid processing process of processing the wafer surface by using a liquid to remove minute dusts or a native oxide layer on the wafer surface with a washing fluid such as a chemical solution.

For example, a single-type spin washing apparatus washing the wafer removes dusts or a native oxide on the wafer surface by rotating the wafer while supplying, for example, alkaline or acid chemical solutions to the surface of the wafer by using a nozzle. In this case, after remaining chemical solutions are removed by rinse washing using, for example, deionized water from the wafer surface, the wafer surface is dried by a spin dry where remaining solutions are brushed away while rotating the wafer.

However, with high integration of the semiconductor device, a problem such as so-called a pattern collapse has grown serious in a processing of removing the solutions. The pattern collapse is a phenomenon in which the balance of a surface tension horizontally pulling the convex portion is lost, and, as a result, the convex portions fall down toward the side where more solutions remain at the time of drying the remaining solutions on the wafer surface, as solutions remaining at the left and right sides of a convex portion of concave and convex portions forming a pattern are unevenly dried.

As a technique of removing the solutions remaining on the water surface while suppressing the pattern collapse, a drying method using a supercritical state fluid (a supercritical fluid) is widely known. The viscosity of the supercritical fluid is lower than a liquid and the ability to dissolve is higher than the liquid. In addition, there is no interface between the supercritical fluid and the liquid or gas which is in equilibrium state with the supercritical fluid. Therefore, the wafer attached with the liquid is substituted with the supercritical fluid, and thereafter, when the supercritical fluid is changed to a gaseous state, the liquid may be dried without being influenced by the surface tension.

Herein, Japanese Patent Application Laid-Open No. 2008-72118 discloses a technology in which a substrate washed by a washing unit is transferred into a drying apparatus by a substrate transferring robot and the substrate makes contacts to the supercritical fluid in the drying apparatus to remove a washing fluid attached to the surface of the substrate. In the technology disclosed in Japanese Patent Application No. 2008-72118, a substrate to be processed is carried into a transfer chamber and transferred to the transferring robot. The substrate is then transferred to a drying processing chamber and the corresponding substrate is dried by using the supercritical fluid. As a result, the surface of the substrate remains to be exposed to a gaseous atmosphere until the processing starts. Therefore, since the liquid on the surface of the substrate is dried until the processing by the supercritical fluid starts, a pattern may be collapsed. Further, since the transferring robot keeps the substrate in a horizontal direction, dusts such as particles attached to the substrate are wound up by the supercritical fluid, and, thereafter, dropped to the surface of the substrate, which may contaminate a forming area of the semiconductor device. See, for example, Japanese Patent Application No. 2008-72118: Paragraphs [0025] to [0029] and FIG. 1.

SUMMARY

The present disclosure has been made in an effort to provide a substrate processing apparatus capable of drying a substrate to be processed while suppressing a pattern collapse or occurrence of contamination, a substrate processing method, and a storage medium storing the method.

An exemplary embodiment of the present disclosure provides a substrate processing apparatus including: a processing vessel where a liquid in which a substrate to be processed is immersed is substituted with a substitution fluid of a supercritical state to dry the substrate; a substrate holding unit to hold the substrate in a longitudinal direction in the processing vessel; a substitution fluid supplying unit to supply the substitution fluid in a liquid state or supercritical state to the processing vessel; an energy supplying unit to change the substitution fluid from the liquid state to the supercritical state or maintain the supercritical state of the substitution fluid in the processing vessel by performing at least one of heating or pressurizing of the substitution fluid; a liquid discharging unit formed below the substrate, which is held in the substrate holding unit in order to substitute the liquid with the supercritical-state substitution fluid by discharging the liquid from the processing vessel; and an exhaust unit to depressurize the processing vessel by discharging the supercritical-state substitution fluid subjected to substitution with the liquid from the processing vessel and dry the substrate by changing the substitution fluid from the supercritical state to a gaseous state.

The substrate processing apparatus may have the following features:

(a) The substrate processing apparatus may further include a liquid bath disposed in the processing vessel while the substrate is immersed in the liquid and including the liquid discharging unit.

(b) The liquid bath may be configured to move between an inner part and an outer part of the processing vessel.

(c) The substitution fluid supplying unit may supply the substitution fluid to a space between an inner surface of the processing vessel and an outer surface of the liquid bath.

(d) The liquid may be used to prevent the surface of the substrate from being dried.

According to the exemplary embodiments of the present disclosure, since a liquid in which a substrate is immersed is substituted directly with a fluid of a supercritical state to dry the substrate, the surface of the substrate is prevented from being natively dried until a processing using the supercritical fluid starts, thereby preventing a pattern collapse from occurring. Further, since the substrate is kept in the longitudinal direction, for example, even in the case where dusts attached to the substrate are dispersed by the liquid or the supercritical-state fluid, the surface of the substrate is not provided at a location where the dusts move down by gravity, and, as a result, the recontamination of the substrate is prevented from being occurred.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In an embodiment of the present disclosure, a substrate processing apparatus is disclosed which comprises a processing vessel where a liquid in which a substrate to be processed is immersed is substituted with a substitution fluid of a supercritical state to dry the substrate to be processed, a substrate holding unit to hold the substrate to be processed in the longitudinal direction in the processing vessel, a substitution fluid supplying unit to supply the substitution fluid in a liquid state or supercritical state to the processing vessel, an energy supplying unit to change the substitution fluid from the liquid state to the supercritical state or maintain the supercritical state of the substitution fluid in the processing vessel by performing at least one of heating or pressurizing of the substitution fluid, a liquid discharging unit formed below the substrate to be processed, which is held in the substrate holding unit in order to substitute the liquid with the supercritical-state substitution fluid by discharging the liquid from the processing vessel, and an exhaust unit to depressurize the processing vessel by discharging the supercritical-state substitution fluid subjected to substitution with the liquid from the processing vessel and dry the substrate to be processed by changing the substitution fluid from the supercritical state to a gaseous state.

The substrate processing apparatus further comprises a liquid bath disposed in the processing vessel while the substrate to be processed is immersed in the liquid and including the liquid discharging unit, and the liquid bath is configured to move between an inner part and an outer part of the processing vessel. Also, in the substrate processing apparatus, the substitution fluid supplying unit supplies the substitution fluid to a space between an inner surface of the processing vessel and an outer surface of the liquid bath, and the liquid is used to prevent the surface of the substrate to be processed from being dried.

In another embodiment of the present disclosure, there is provided a substrate processing method including placing a substrate to be processed in a processing vessel so that the substrate to be processed is immersed in a liquid in the longitudinal direction, supplying a substitution fluid of a liquid state or supercritical state to the processing vessel, changing the substitution fluid from the liquid state to the supercritical state or maintaining the supercritical state of the substitution fluid in the processing vessel by performing at least one of heating or pressurizing of the substitution fluid, discharging the liquid from a lower part of the substrate to be processed in order to substitute the liquid with the substitution fluid of the supercritical state, and depressurizing the processing vessel by discharging the supercritical-state substitution fluid subjected to substitution with the liquid from the processing vessel and drying the substrate to be processed by changing the substitution fluid from the supercritical state to a gaseous state.

The substrate processing method further comprises filling the liquid in a liquid bath placed in the processing vessel, and transferring the substrate to be processed to the liquid bath and immersing the substrate to be processed in the liquid in the longitudinal direction, wherein in the substituting of the liquid with the supercritical-state substitution fluid, the supercritical-state substitution fluid is received into the liquid bath from the upper part of the substrate to be processed, which is immersed in the liquid to discharge the liquid to the outside of the processing vessel through the liquid bath.

The substrate processing method further comprises transferring the substrate to be processed to the liquid bath outside the processing vessel, and moving the liquid bath the inside of the processing vessel through the carry-in and out holes formed in the processing vessel and closing the carry-in and out holes.

In the supplying of the liquid-state or supercritical-state substitution fluid to the processing vessel, the substitution fluid is supplied to a space between an inner surface of the processing vessel and an outer surface of the liquid bath. Also, the liquid is used to prevent the surface of the substrate to be processed from being dried.

In yet another embodiment of the present disclosure, there is provided a storage medium storing a computer program used in a substrate processing apparatus to dry a substrate to be processed, which is immersed in a liquid, wherein the porgram is consisted of steps to execute the substrate processing method as disribed above.

Figure 1:
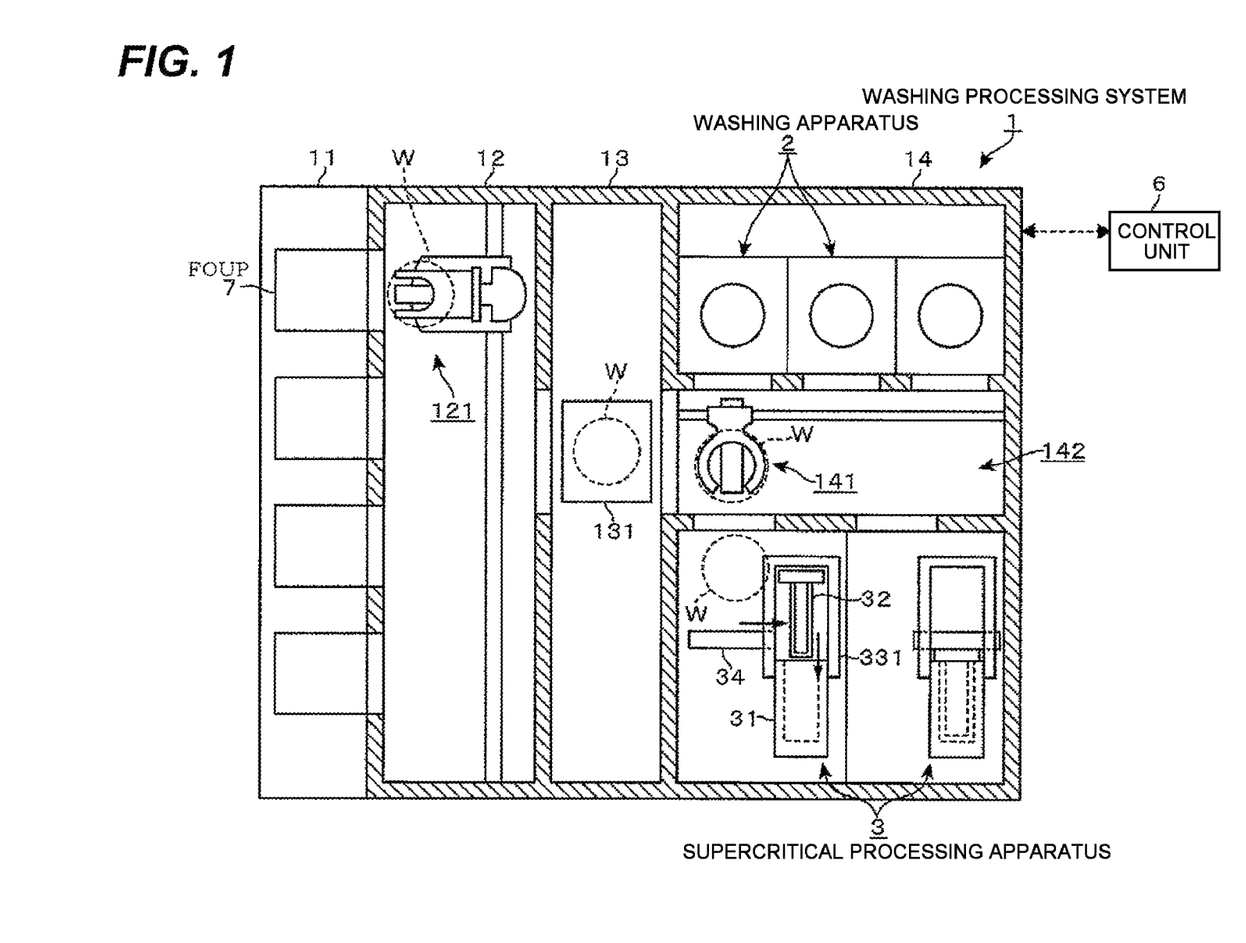
FIG. 1 is a plan view of a washing system according to an exemplary embodiment of the present disclosure.

As one example of a substrate processing system having a substrate processing apparatus according to an exemplary embodiment of the present disclosure, a washing processing system 1 will be described including a washing apparatus 2 washing a wafer W which is a substrate to be processed by supplying a washing fluid to the wafer W and a supercritical processing apparatus 3 drying the washed wafer W by using a supercritical fluid. FIG. 1 is a transverse plan view showing an overall configuration of washing processing system 1. When a left side is set as a front with respect to the figure, washing processing system 1 includes, for example, a loading unit 11 on which a FOUP 7 receiving several wafers W having a diameter 300 mm is loaded, a carry-in/out unit 12 where the wafer W is carried in and out between FOUP 7 and washing processing system 1, a passing unit 13 where the wafer W is passed between carry-in/out unit 12 and a wafer processing unit 14 at the rear end thereof, and wafer processing unit 14 where the wafer W is carried into a washing apparatus 2 and a supercritical processing apparatus 3 in sequence to be subjected to a washing processing or a supercritical processing that are connected in the order from the front.

Loading unit 11 is configured by a loading stand capable of loading, for example, four (4) FOUPs 7 and each FOUP 7 loaded on the loading stand is connected to carry-in/out unit 12. In carry-in/out unit 12, by an opening/closing mechanism (not shown) installed on a connection surface with each FOUP 7, an opening/closing door of FOUP 7 is taken off, such that a first transfer mechanism 121 transfers the wafer W between an inner part of FOUP 7 and passing unit 13. The first transfer mechanism freely advances and retreats in a forward and reward directions, freely moves in the lateral direction, freely rotates on the circumference of a perpendicular shaft, and freely elevates. In passing unit 13 of which the front and rear sides engage in carry-in/out unit 12 and wafer processing unit 14, for example, a passing rack 131 serving as a buffer capable of loading eight (8) wafers W is provided, and the wafer W is transferred between carry-in/out unit 12 and wafer processing unit 14 through passing rack 131.

In wafer processing unit 14, a wafer transfer path 142 extending forward and backward from an opening between passing unit 13 and wafer processing unit 14 is installed. In addition, at the left side of wafer transfer path 142 when viewed from the front of wafer transfer path 142, for example, three (3) washing apparatuses 2 are installed in line along wafer transfer path 142. And, likewise, at the right side of wafer transfer path 142, for example, two (2) supercritical processing apparatuses 3 which are substrate processing apparatuses according to exemplary embodiment of the present disclosure are installed in line. In wafer transfer path 142, a second transfer mechanism 141 is installed, which can move along wafer transfer path 142, advance and retreat toward washing apparatus 2 and supercritical processing apparatus 3 at the left and right sides thereof, rotate on the circumference of the perpendicular shaft, and elevate, such that the wafer W may be transferred between passing rack 131 and each washing apparatus 2 and supercritical processing apparatus 3. Herein, the number of washing apparatuses 2 or supercritical processing apparatuses 3 that are disposed in wafer processing unit 14 is not limited to the above-mentioned example, but properly selected depending on the number of the wafers W processed per unit hour or a difference in processing time in washing apparatuses 2 or supercritical processing apparatus 3. Further, the layout of washing apparatus 2 or supercritical processing apparatus 3 may also employ a layout different from the example shown in FIG. 1.

Washing apparatus 2 is configured as, for example, a single-type washing apparatus washing each wafer W by a spin washing. For example, as shown in a longitudinal side view of FIG. 2, the wafer W is held substantially horizontally by a wafer holding mechanism 23 disposed in an external chamber 21 forming a processing space and wafer holding mechanism 23 is rotated on the circumference of the vertical shaft to rotate the wafer W. In addition, a nozzle arm 24 enters an upper part of the rotating wafer W to supply a chemical solution along with a rinse solution from a chemical solution nozzle 241 installed in the front end thereof in a predetermined order to wash the wafer surface. Further, a chemical solution supplying path 231 is formed in wafer holding mechanism 23 as well, so a back-surface washing of the wafer W is made by using the chemical solution and the rinse solution supplied from path 231.

Figure 2:
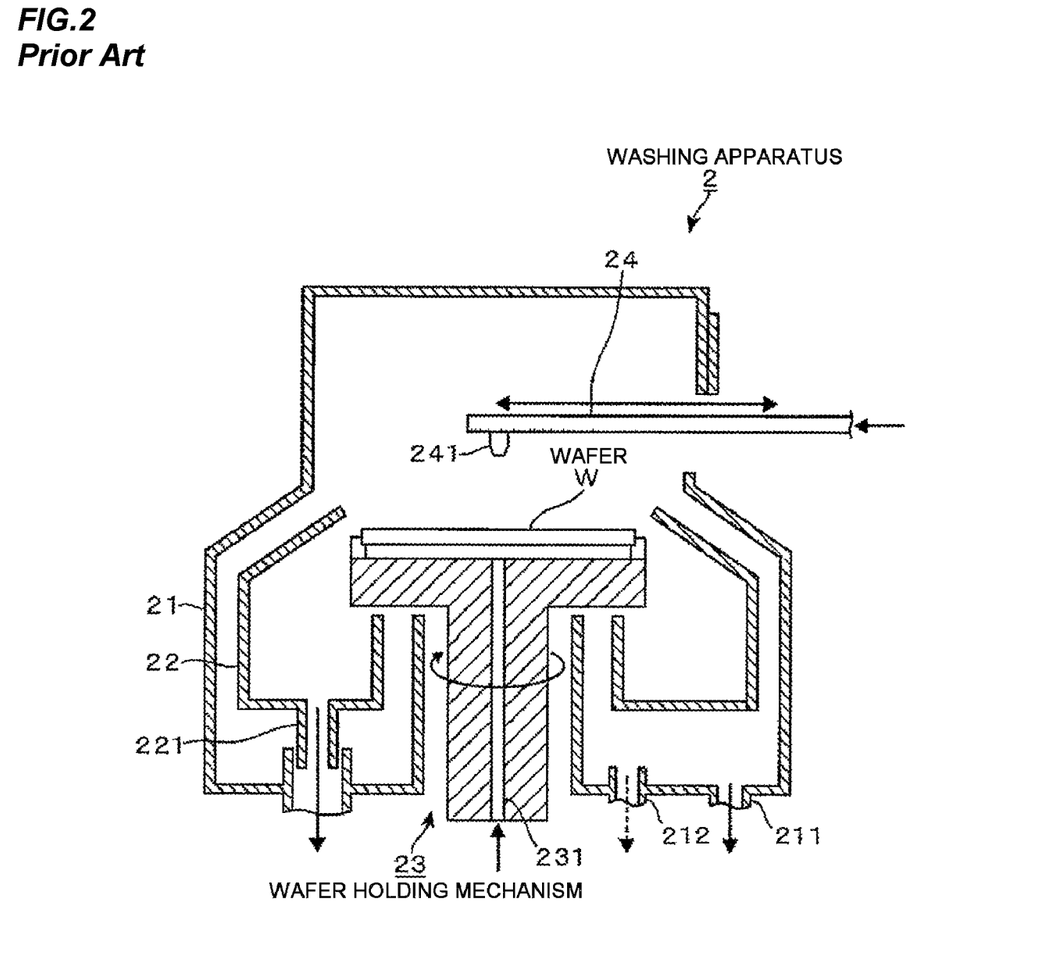
FIG. 2 is a longitudinal side view showing one example of a washing apparatus in the washing system.

The washing processing is performed, for example, in a sequence following removal of particles or an organic contaminated material by using, for example, an SC1 solution (a mixed solution of ammonia and a hydrogen peroxide) which is an alkaline chemical solution, rinse washing using deionized water (DIW) which is a rinse solution, removal of a native oxide layer by using a hydrofluoric acid aqueous solution (hereinafter, diluted hydrofluoric acid (DHF)) which is an acid chemical solution, and rinse washing using the DIW. These chemical solutions are received in an inner cup 22 disposed in an external chamber 21 or received in external chamber 21, and discharged from drain holes 221 and 211. Further, an atmosphere in external chamber 21 is exhausted from an exhaust port 212.

When the washing processing by the chemical solution is terminated, wafer holding mechanism 23 stops to rotate and isopropyl alcohol (IPA) for preventing drying is supplied to the surfaces thereof to be substituted with DIW remaining on the surface and the back surface of the wafer W. The wafer W completed with the washing processing is transferred to second transfer mechanism 141 by, for example, a passing mechanism (not shown) installed in wafer holding mechanism 23 just as the IPA is attached to the surfaces thereof to be carried out from washing apparatus 2.

The wafer W completed with the washing processing in washing apparatus 2 is transferred to supercritical processing apparatus 3 with the IPA is being attached to the surfaces thereof, and thereafter, a supercritical processing is performed in which a liquid is removed from the surface of the water W by using the supercritical fluid and the wafer W is dried. Hereinafter, the configuration of supercritical processing apparatus 3 according to the exemplary embodiment of the present disclosure will be described with reference to FIGS. 3 to 6. In FIGS. 3 to 9, the configuration will be described by setting a left side as a front side with respect to the figures.

Figure 3:
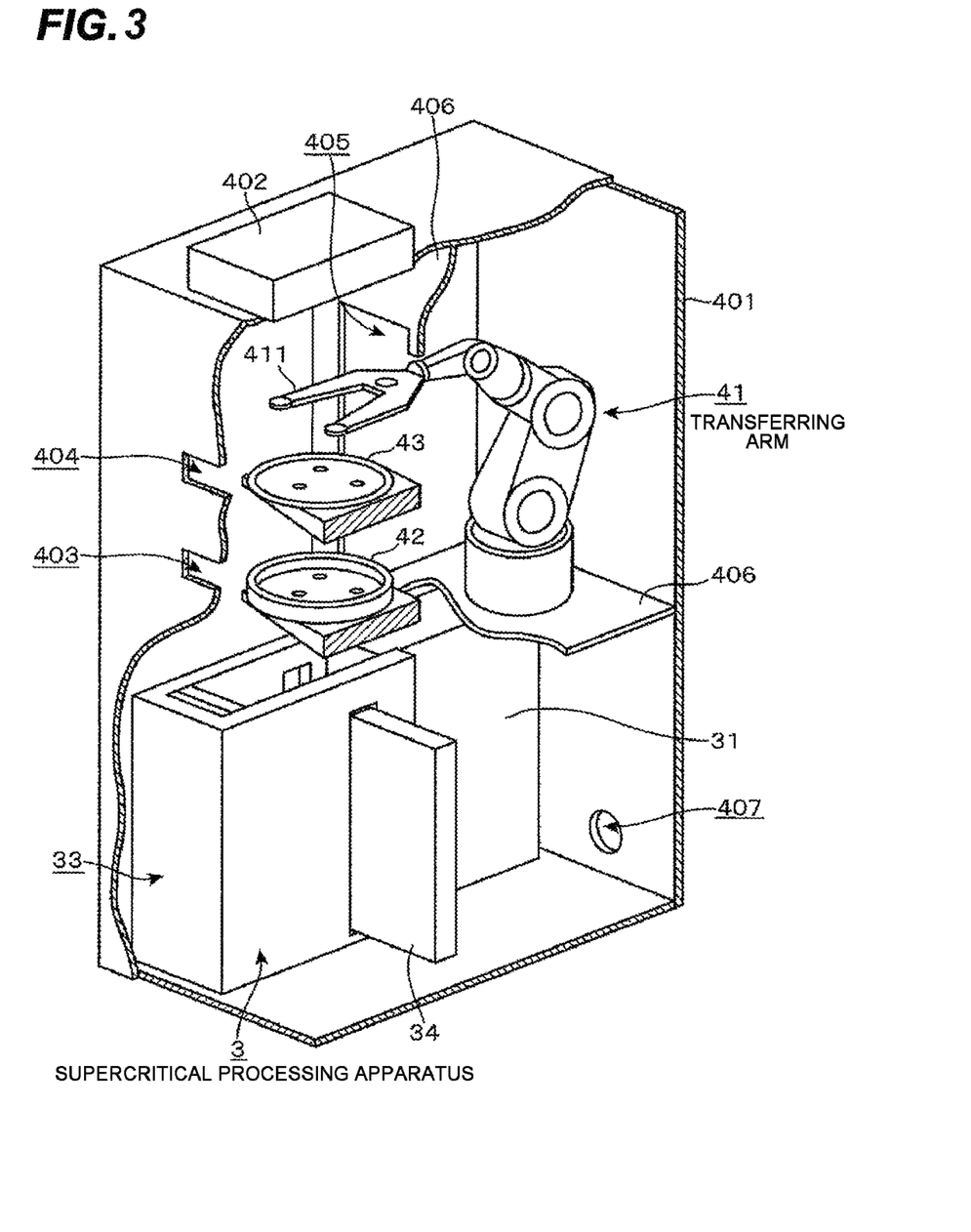
FIG. 3 is a perspective view showing examples of a supercritical processing apparatus and a wafer passing mechanism, according to an exemplary embodiment of the present disclosure.

FIG. 3 is a partial fractured perspective view showing an inner part of a case 401 housing each supercritical processing apparatus 3. Supercritical processing apparatus 3 is disposed on, for example, a bottom surface in each case 401 and the passing mechanism passing the wafer W between supercritical processing apparatus 3, and the above-described second transfer mechanism 141 is installed in a space above supercritical processing apparatus 3. In this example, as the passing mechanism, a passing arm 41 holding and transferring the wafer W, a carry-in rack 42 on which an unprocessed wafer W to be carried into supercritical processing apparatus 3 is exclusively loaded, and a carry-out rack 43 on which a processed wafer W to be carried out from supercritical processing apparatus 3 is exclusively loaded are installed.

Passing arm 41 is disposed, for example, around the rear portion of and above supercritical processing apparatus 3 disposed on a base of case 401 and is, for example, a 6-shaft multi-jointed arm capable of holding one wafer each by gripping the lateral circumferential surface of the wafer W by a fork 411 installed at the front end thereof. Further, passing arm 41 is installed in a space partitioned by a partition plate 406 to prevent particles generated by operating the passing arm 41 from entering a space to which the wafer W is transferred. In the figure, reference numeral 405 represents an access entrance for allowing passing arm 41 to enter a space where the wafer W is passed.

Carry-in rack 42 and carry-out rack 43 are installed so that two racks 42 and 43 stand in line vertically, for example, around the front portion of and above supercritical processing apparatus 3. In this example, carry-in rack 42 on which an unprocessed wafer W is placed is disposed in a lower part and carry-out rack 43 on which a processed wafer W is placed is disposed in an upper part. The carry-in and out racks 42 and 43 are configured as a loading rack capable of holding one wafer W each horizontally, and for example, the wafer W may be transferred between second transfer mechanism 141 and passing arm 41 through three elevation pins installed on each of racks 42 and 43.

Further, carry-in rack 42 has a dish shape capable of being filled with the liquid and the wafer W loaded on carry-in rack 42 is kept in an immersed state in IPA supplied from an IPA supplying unit (not shown) to prevent native drying of the surface of the wafer W, thereby preventing pattern collapse from occurring before the supercritical processing.

Further, when the placement locations of carry-in rack 42 and carry-out rack 43 are viewed from the front, racks 42 and 43 are disposed around the upper side portion of an internal chamber 32 to be described below, which is opened toward the top surface from a passing location of the wafer W. A transfer path for transferring the wafer W upward and downward is ensured by the placement to carry in and out the wafer W from internal chamber 32 rapidly without interfering with carry-in rack 42 or carry-out rack 43.

In FIG. 3, reference numeral 403 represents a carry-in hole through which the wafer W of which washing processing is terminated in washing apparatus 2, reference numeral 404 represents a carry-out hole through which the wafer W of which supercritical processing is terminated, and second transfer mechanism 141 enters case 401 through carry-in and out holes 403 and 404. Further, in FIG. 3, reference numeral 402 represents a fan filter unit (FFU) for forming downflow of a clean air in case 401 and reference numeral 407 represents an exhaust port of the downflow.

Figure 4:
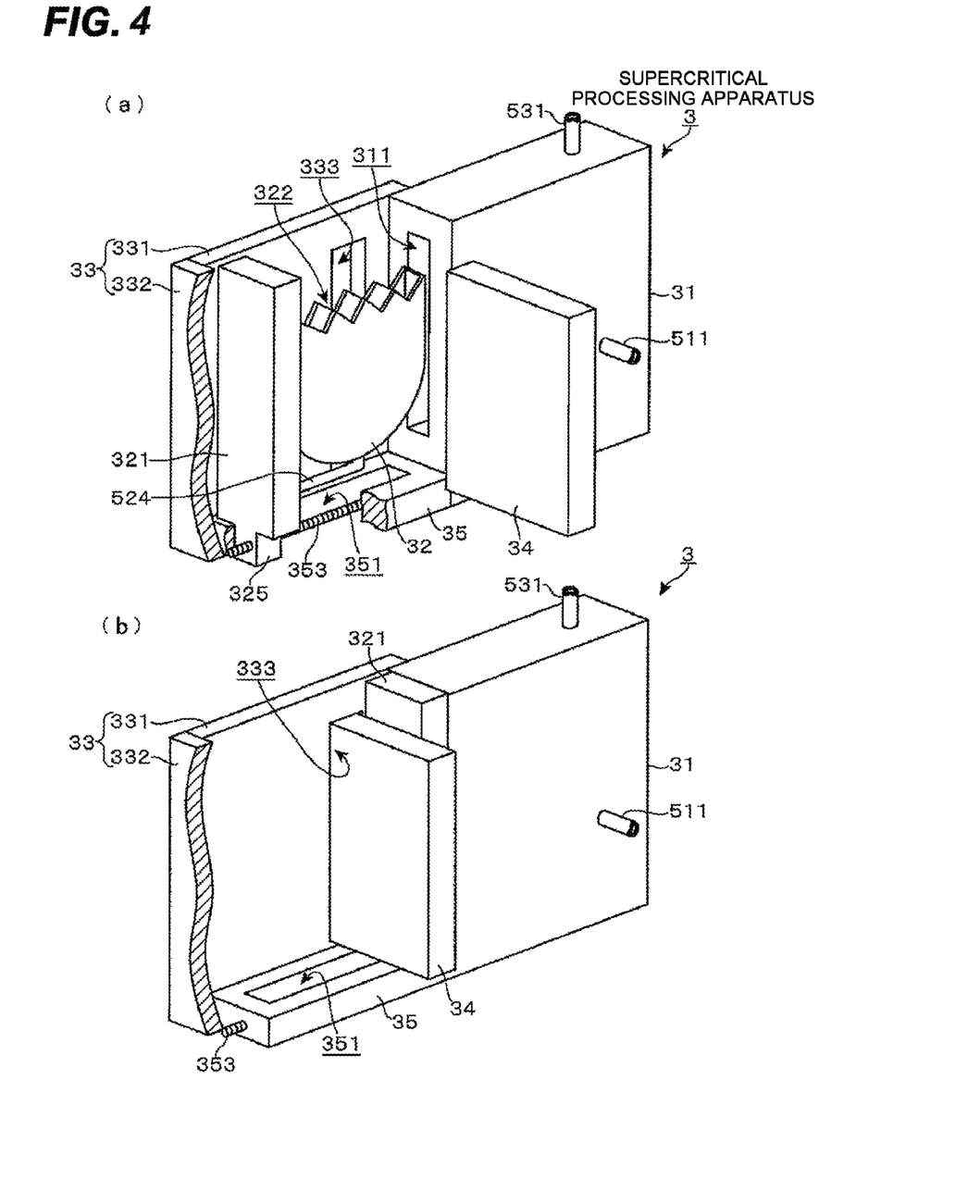
FIG. 4 is a partial fractured perspective view showing an exterior configuration of the supercritical processing apparatus.
Figure 5:
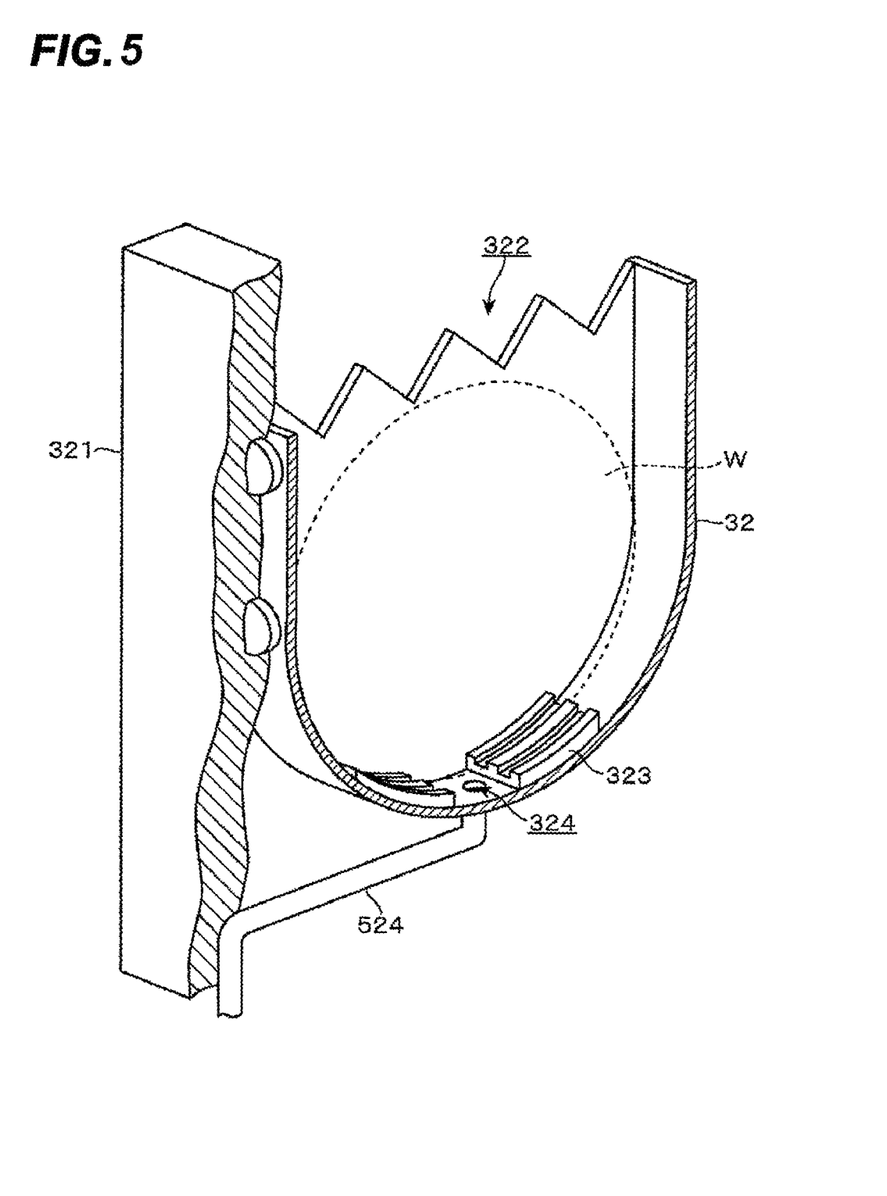
FIG. 5 is a partial fractured perspective view showing a configuration of an internal chamber installed in the supercritical processing apparatus.

For example, supercritical processing apparatus 3 installed in each case 401 have the substantially same configuration as each other and may dry the wafer W without forming a gas-liquid interface on the surface of the wafer W by using the supercritical fluid. As shown in FIGS. 4 and 5, supercritical processing apparatus 3 includes an external chamber 31 as a processing vessel where the supercritical processing is made and an internal chamber 32 carried into external chamber 31 while the wafer W is immersed in the IPA. Internal chamber 32 corresponds to a liquid bath of the exemplary embodiment.

Figure 6:
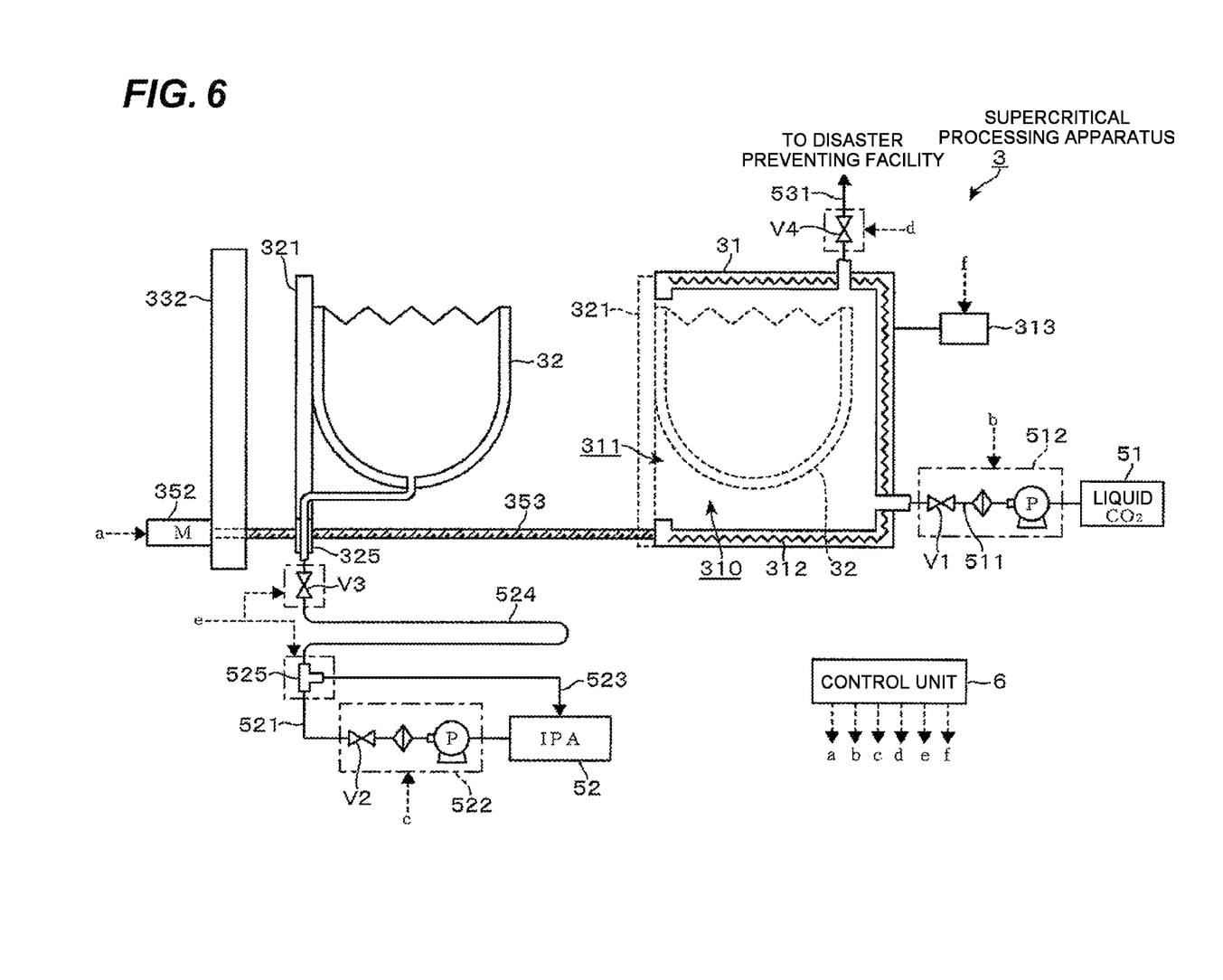
FIG. 6 is an explanation diagram showing supplying and discharging systems of various treatment fluids to the supercritical processing apparatus.
Figure 7:
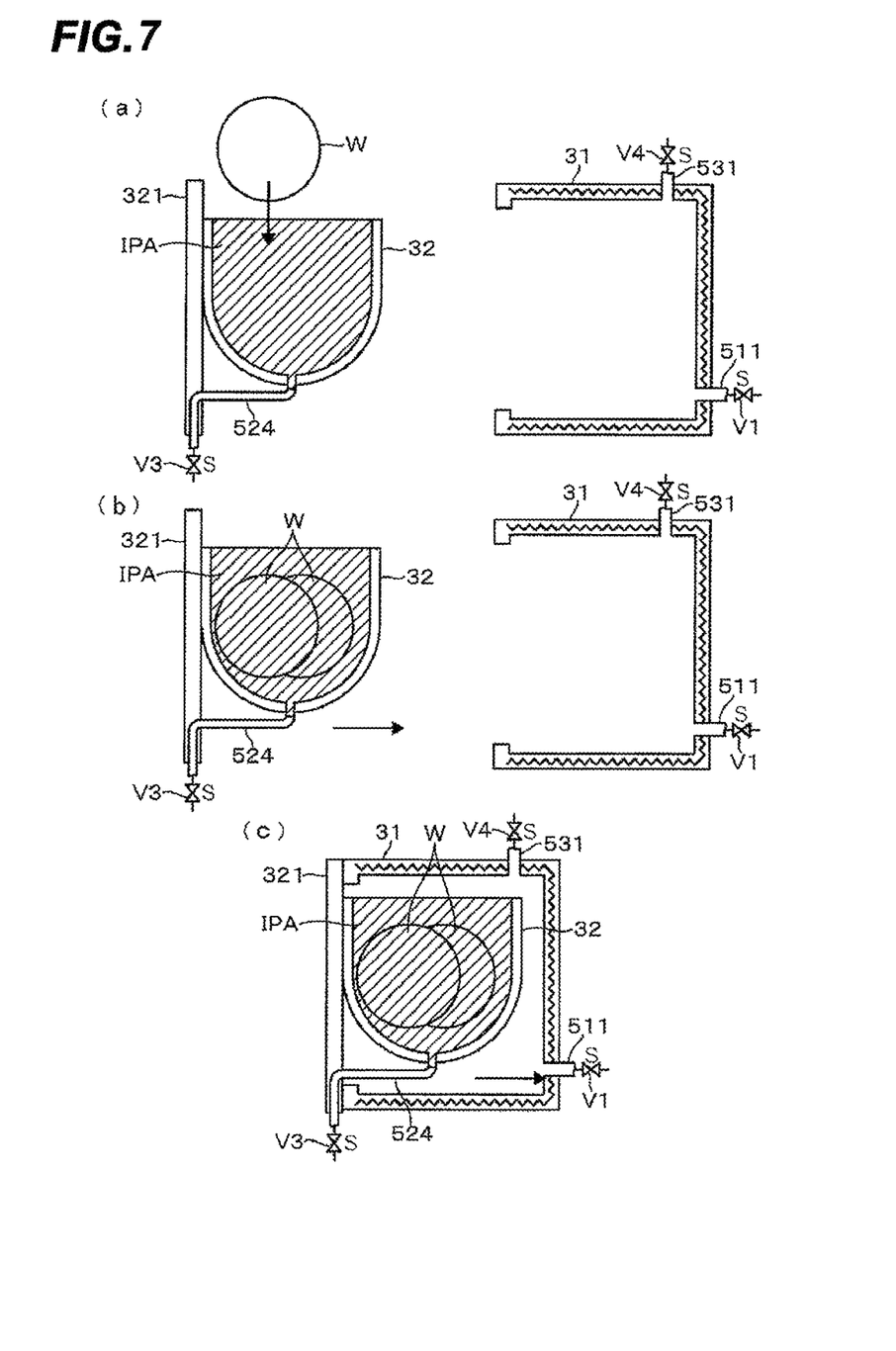
FIG. 7 is a first explanation diagram showing an operation of the supercritical processing apparatus.
Figure 8:
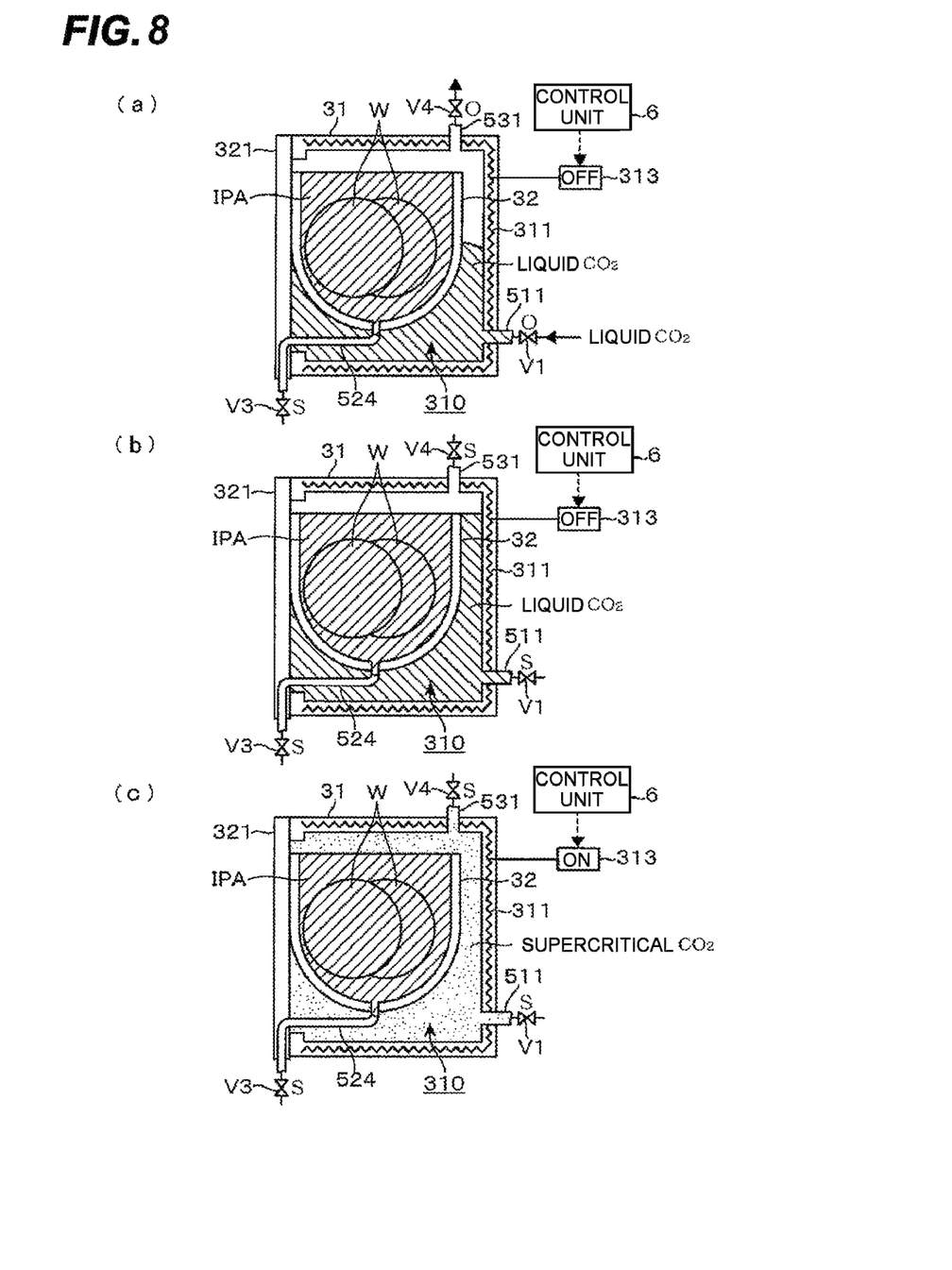
FIG. 8 is a second explanation diagram showing an operation of the supercritical processing apparatus.
Figure 9:
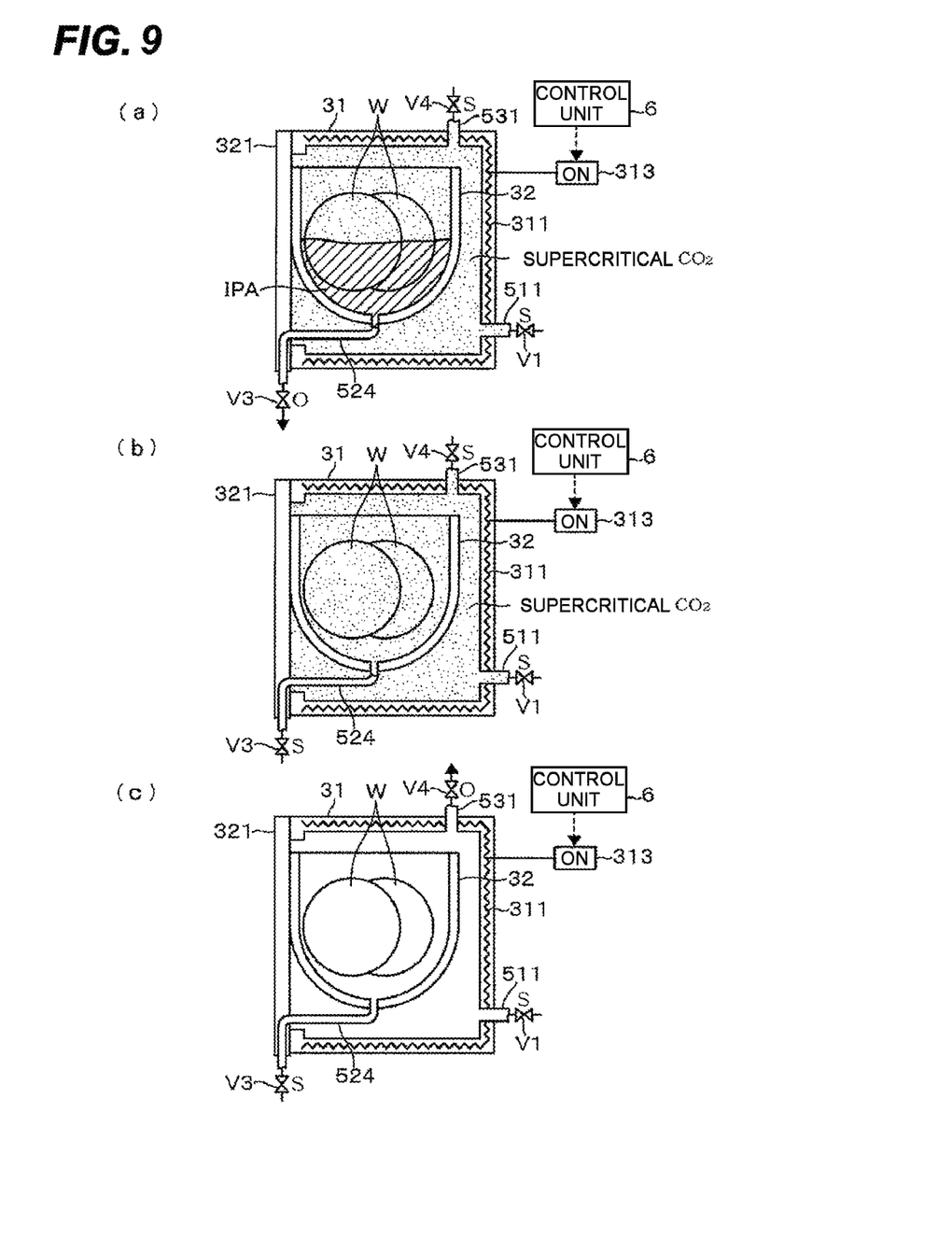
FIG. 9 is a third explanation diagram showing an operation of the supercritical processing apparatus.

As shown in each figure of FIG. 4, external chamber 31 is configured by, for example, a pressure tight case having a rectangular parallelepiped shape which is flat in the longitudinal direction, and, as shown in FIG. 6, external chamber 31 includes a processing space 310 housing internal chamber 32 therein. As shown in FIG. 1, in external chamber 31, a surface having a small width is disposed to face wafer transfer path 142, and an opening 311 for carrying in and out internal chamber 32 is formed on the front surface thereof (see FIG. 4A).

Further, as shown in FIG. 6, a heater 312 constituted by, for example, a resistant heating element is installed in external chamber 31. Heater 312 heats the main body of external chamber 31 by using power feeding from a power supply unit 313, and, as a result, liquid $CO_2$ as a substitution fluid may be in a supercritical state in processing space 310. Heater 312 corresponds to an energy supplying unit of the exemplary embodiment of the present disclosure.

Further, as shown in FIGS. 4A and 4B, a $CO_2$ supplying line 511 is connected to a position around a base of the side of the main body of external chamber 31 and $CO_2$ supplying line 511 is connected to a $CO_2$ storing unit 51 through a solution sending mechanism 512 constituted by a valve V1, a filter, and a pump, as shown in FIG. 6. For example, the liquid $CO_2$ is stored in $CO_2$ storing unit 51. These $CO_2$ supplying line 511, solution sending mechanism 512, and $CO_2$ storing unit 51 constitute a substitution fluid supplying unit for supplying the liquid $CO_2$ which is the substitution fluid into processing space 310 of external chamber 31.

Further, as shown in FIGS. 4 and 6, for example, reference numeral 531 installed on a ceiling surface of the main body of external chamber 31 represents an exhaust line for depressurizing the inner part of a processing vessel 320 by exhausting an atmosphere in processing space 310 at the time of supplying the liquid $CO_2$ to processing space 310, and exhausting $CO_2$ of the supercritical state which is subjected to the completion of the supercritical processing. Exhaust line 531 may exhaust and seal the inner part of processing space 310 by opening and closing a valve V4. Herein, valve V4 also serves as a pressure regulating valve and may exhaust the atmosphere in processing space 310 while regulating the pressure in processing space 310. From a point of exhausting the $CO_2$ of the supercritical state after processing, exhaust line 531 corresponds to an exhaust unit of the exemplary embodiment of the present disclosure.

As shown in FIGS. 4A and 5, internal chamber 32 is a case formed to house, for example, two (2) wafers W in the longitudinal direction and may hold the wafers W in the state in which the wafers W are immersed in the IPA used as a dry preventing liquid. Internal chamber 32 has a flat shape in the longitudinal direction, which has a width smaller than that of processing space 310. Therefore, when internal chamber 32 is disposed in processing space 310, a space for allowing the liquid or the $CO_2$ of the supercritical state supplied to processing space 310 to be circulated is formed between an inner surface of external chamber 31 and an outer surface of internal chamber 32. Internal chamber 32 according to the exemplary embodiment of the present disclosure is configured to house, for example, two (2) wafers W for a necessity to make a balance of the volume of processing space 310 handling the supercritical fluid as small as possible and a wafer W processing speed of the entire washing processing system 1. However, the number of the wafers W that can be housed in internal chamber 32 is not limited thereto, but only one or three or more wafers W may be housed in internal chamber 32. Further, in the case in which several wafers W are housed in internal chamber 32, surfaces of, for example, adjacent wafers W with patterns may be disposed to face each other to prevent particles from being attached to the surfaces. In the case in which the number of the wafers W is odd, a pattern formed on the surface of one remaining wafer W may face another wafer W to prevent the pattern formed surface from facing a wall surface of internal chamber 32.

As shown in FIG. 5, a top surface of internal chamber 32 is opened and the wafer W held on passing arm 41 is thus carried into internal chamber 32 through the opening. Further, for example, a saw-like notch unit 322 is formed in the opening of internal chamber 32 to allow the supercritical fluid in processing space 310 to be evenly and easily introduced into internal chamber 32. However, for the convenience of illustration, in the figures other than FIGS. 4 to 6, notch unit 322 of internal chamber 32 is not shown.

Further, a base of internal chamber 32 has the same curved shape as the wafer W and a wafer holding member 323 for holding two (2) wafers W is installed on the inner bottom surface thereof. A groove having the same shape as the wafer W is formed in wafer holding member 323 and the periphery of the wafer W is fitted in the groove to keep the wafer W in the longitudinal direction. Further, placement locations of the grooves or intervals among the grooves in the wafer holding member 323 are adjusted so that the IPA supplied to internal chamber 32 sufficiently contacts the surface of each wafer W and further, even though fork 411 holding the wafer W enters internal chamber 32, the wafer W or fork 411 does not interfere with other wafers W or a main body of internal chamber 32. Wafer holding member 323 corresponds to a substrate holding unit of the exemplary embodiment of the present disclosure.

As shown in FIG. 5, a region is provided where the wafer holding member 323 is not formed is provided on the bottom surface of internal chamber 32, and an opening 324 which is a liquid discharging unit for supplying the IPA to internal chamber 32 and discharging the IPA is formed in the region. Opening 324 is connected to an IPA supplying and discharging line 524 which is connected to a changeover valve 525 through an inner part of a covering member 321 to be described below (see FIG. 6). As described below, since internal chamber 32 can move forward and backward, supplying and discharging line 524 is configured by, for example, a flexible pipe having pressure resistance to be transformed in accordance with the movement of internal chamber 32. In FIG. 6, reference numeral V3 represents a valve.

Changeover valve 525 is connected to an IPA supplying line 521 for supplying the IPA to internal chamber 32, a recovery line 523 for recovering the IPA discharged from internal chamber 32, and supplying and discharging line 524. IPA supplying line 521 is connected to an IPA storing unit 52 storing the IPA through solution sending mechanism 522 constituted by an open/close valve V2, a filter, and a pump. Meanwhile, recovery line 523 is connected directly to IPA storing unit 52 to recover the IPA discharged from internal chamber 32.

As shown in FIG. 5, internal chamber 32 is fixed to, for example, covering member 321 having a thick plate shape at the side having a small width. In addition, internal chamber 32 may be transferred between a passing location outside external chamber 31 and a processing location in processing space 310 In the passing location, the wafer W is passed between internal chamber 32 and passing arm 41 by moving covering member 321 forward and backward in the horizontal direction. Further, as represented by a dashed line in FIG. 6, covering member 321 transferring internal chamber 32 to the processing location also serves to block opening 311 of external chamber 31. An O-ring (not shown) is installed around opening 311 of external chamber 31 to surround opening 311, and covering member 321 may seal processing space 310 by tightly pushing the O-ring.

As shown in FIGS. 4A and 4B, covering member 321 is supported on a bearing stand 35, and, for example, a travelling track 351 cutting bearing stand 35 is formed on bearing stand 35 along a direction to transfer internal chamber 32. Meanwhile, a travelling member 325 that extends downwardly toward the inside of travelling track 351 is installed at a lower end of covering member 321. In addition, as shown in FIGS. 4A and 6, a ball screw 353 extended on travelling track 351 penetrates travelling member 325, and travelling member 325 and ball screw 353 constitute a ball screw mechanism.

In addition, travelling member 325 travels within travelling track 351 by rotating ball screw 353 in any one direction of left and right directions using a driver 352 formed at one end of ball screw 353, and, as a result, covering member 321 is moved to transfer internal chamber 32 from the passing location to the processing location. Further, contrary to this, by rotating ball screw 353 in an opposite direction thereto, internal chamber 32 may be transferred from the processing location to the passing location. However, a mechanism for moving covering member 321 is not limited to an example of the ball screw mechanism, but, for example, a linear motor or an extendable arm, and an air cylinder may be used.

Further, as shown in FIGS. 4A and 4B, a circumferential wall 33 is installed in supercritical processing apparatus 3 to cover a region where covering member 321 or internal chamber 32 moves from the side. Circumferential wall 33 includes two (2) side wall members 331 extended in the travelling direction of covering member 321 and a front wall member 332 installed to face opening 311 of external chamber 31. In addition, one end of the inside of each of two (2) side wall member 331 is strongly fixed to the side wall surface of external chamber 31, and as a result, circumferential wall 33 is integrated with external chamber 31.

Further, supercritical processing apparatus 3 includes a fixation plate 34 for strongly pressing covering member 321 toward external chamber 31 against internal pressure applied to covering member 321 by keeping making $CO_2$ in the supercritical state within processing space 310. Fixation plate 34 is configured to move horizontally between a location retreated from the region where internal chamber 32 and covering member 321 moves, and a location where covering member 321 is pressed toward external chamber 31 from the front by using a driving mechanism (not shown).

Meanwhile, a fitting hole 333 in which fixation plate 34 moving horizontally can penetrate is formed in each side wall member 331, and fixation plate 34 that stands by at a stand-by location outside circumferential wall 33 (side wall member 331) passes through fitting hole 333 of side wall member 331 at one side to move to a fixation location. Further, both left and right ends of fixation plate 34 moved to fixation location are fitted in fitting hole 333, and, as a result, fixation plate 34 is locked to side wall member 331 together with a latch to strongly press covering member 321 toward external chamber 31 against the pressure in processing space 310 (see supercritical processing apparatus 3 of FIG. 1 and FIG. 4B).

Washing processing system 1 including supercritical processing apparatus 3 having the above-mentioned configuration is connected to a control unit 6 as shown in FIGS. 1 and 6. Control unit 6 is constituted by, for example, a computer including a CPU and a memory unit (not shown). A program is recorded in the memory unit. The program is implemented with grouped steps (commands) related to the control associated with the operations of washing processing system 1 or washing apparatus 2, and supercritical processing apparatus 3, that is, the control of the operations where the wafer W is taken out from FOUP 7 and transferred to washing apparatus 2 to be washed, the wafer W is subjected to the supercritical processing in supercritical processing apparatus 3, and the wafer W is carried into FOUP 7. The program is stored in recording media such as a hard disk, a compact disk, a magnet optical disk, and a memory card and installed in the computer therefrom.

In particular, in regards to supercritical processing apparatus 3, control unit 6 is connected to each of solution sending mechanisms 512 and 522 of $CO_2$ supplying line 511 and IPA supplying line 521 to control the supplying timing of the liquid $CO_2$ or IPA. And, in addition, control unit 6 controls the discharge pressure of solution sending mechanism 512 based on a detection value of a pressure gauge (not shown) installed in external chamber 31, as shown in FIG. 6. Further, control unit 6 may control the opening/closing timing of each of the valves V1 to V4, control the rotational timing, rotational direction, and rotational quantum of ball screw 353 by driver 352, and switch the lines (IPA supplying line 521 and recovery line 523) connected to changeover valve 525. Moreover, control unit 6 also serves to control the temperature in processing space 310 to a predetermined temperature by increasing and decreasing electric power supplied to heater 312 from power supply unit 313 on the basis of the temperature detection result in processing space 310 from a thermometer (not shown).

An operation of supercritical processing apparatus 3 having the above-mentioned configuration will be described. As described above, when the washing processing is terminated in washing apparatus 2, and the wafer W to which the dry preventing IPA is attached is transferred by second transfer mechanism 141, second transfer mechanism 141 enters any one case 401 through carry-in hole 403 and transfers the wafer W to the elevation pins of carry-in rack 42.

In the case in which the wafer W can be immediately carried in internal chamber 32 of supercritical processing apparatus 3, fork 411 of passing arm 41 enters into a side below the wafer W with the state the wafer W is received in carry-in rack 42, and then, the elevation pins move down to transfer the wafer W to fork 411. In the case in which a waiting time is generated until the wafer W is carried in internal chamber 32, the wafer W is placed in a dish-like carry-in rack 42 by moving down the elevation pins, and the IPA is supplied to the surface of the wafer W to prevent drying. In addition, when a preparation is completed in internal chamber 32, the wafer W is transferred to fork 411 by moving up the elevation pins.

Meanwhile, internal chamber 32 which the wafer W can be carried in is in a stand by state at the passing location while the IPA is filled in internal chamber 32 as shown in FIG. 7A. Passing arm 41 receiving the wafer W from carry-in rack 42 raises the wafer W in the longitudinal direction and rotates each rotation shaft so that the front end of fork 411 faces the opening of internal chamber 32, and thereafter, moves down fork 411 to allow the wafer W to enter internal chamber 32.

By rapidly executing the carry-in operation, when the wafer W is raised in the longitudinal direction, even though some of the IPA attached to the surface of the wafer W is spilled and dropped, a liquid film of IPA remains on the surface of the wafer W only for a short time. Therefore, the wafer W is carried in internal chamber 32 while the liquid film remains and IPA in a concave of the pattern formed in the wafer W is not dried, such that the wafer W is transferred to internal chamber 32 to be immersed in the IPA while suppressing the occurrence of the pattern collapse.

When the lower end of the wafer W is held while being fitted in the groove of wafer holding member 323 by further moving down fork 411, fork 411 is retreated from internal chamber 32 by releasing the holding of the wafer W and moving up passing arm 41. In addition, by repetitively performing the passing operation with respect to two wafers W, the two wafers W are housed in internal chamber 32 and immersed in the IPA, as schematically shown in FIG. 7B. Subsequently, internal chamber 32 is moved up to the processing location by driving ball screw 353 with driver 352 (see FIG. 7C). At this time, the valve V3 of supplying and discharge line 524 is closed to disable the IPA to be discharged from internal chamber 32 (written as 'S' in FIG. 7A, hereinafter, the same as above) and further, in external chamber 31, the valves V1 and V4 of $CO_2$ supplying line 511 and exhaust line 531 are closed as well.

In addition, as shown in FIG. 4B, when fixation plate 34 is moved up to a fixation location from a stand-by, valve V1 of solution sending mechanism 512 at the side of $CO_2$ supplying line 511 is opened location (written as 'O' in FIG. 8A, hereinafter, the same as above) and the pump is actuated to supply the liquid $CO_2$ to processing space 310. For example, when the liquid $CO_2$ is supplied to processing space 310 under atmospheric pressure, some of the liquid $CO_2$ is vaporized, and, as a result, the pressure in processing space 310 is increased and a vapor-phase side atmosphere is in balance with the liquid $CO_2$.

Thereafter, when valve V4 is opened while controlling an opening level so that the atmosphere in processing space 310 is, for example, 7.5 MPa within the range of, for example, 6 MPa to 9 MPa, the vapor-phase atmosphere is sent out while the $CO_2$ supplied form $CO_2$ supplying line 511 is kept in a liquid state, so the inner part of processing space 310 is substituted with the liquid $CO_2$ (see FIG. 8A). In addition, when a liquid surface of the liquid $CO_2$ reaches a location around a lower end of notch unit 322 of internal chamber 32 shown in FIG. 5 and the liquid $CO_2$ can be thus introduced into internal chamber 32, the valves V1 and V4 of $CO_2$ supplying line 511 and exhaust line 531 are closed to seal external chamber 31 (see FIG. 8B).

Subsequently, as shown in FIG. 8C, the electric power is supplied to heater 312 from power supply unit 313 to heat processing space 310 so that the temperature in processing space 310 is, for example, 40° C. within the range of 30 to 90°. Since a critical point of $CO_2$ is 7.38 MPa and 31.1° C., the liquid $CO_2$ is changed to the supercritical state through the heating operation and a gas-liquid interface of $CO_2$ is lost, so $CO_2$ of the supercritical state is filled in processing space 310.

Herein, since a boiling point of IPA under the atmospheric pressure is 82.4°, the IPA in internal chamber 32 maintains a liquid state in processing space 310 under 7.5 MPa and 40° C., and the surface of the wafer W immersed in the IPA is also in a wet state. At this time, as shown in FIG. 9A, when valve V3 of supplying and discharging line 524 is opened, the IPA in internal chamber 32 is pushed out by the supercritical-state $CO_2$ through the opening of internal chamber 32 and gravity is actuated, so the IPA flows toward supplying and discharging line 524. At this time, by switching changeover valve 525 shown in FIG. 6 to recovery line 523, the IPA flowed out from internal chamber 32 is recovered in IPA storing unit 52.

When the IPA is flowed out from supplying and discharging line 524 connected to the bottom surface of internal chamber 32, the supercritical-state $CO_2$ in processing space 310 is expanded to enter internal chamber 32 through an opening on the top thereof. As a result, the IPA in internal chamber 32 is flowed to the lower part from the upper part to be substituted with the supercritical-state $CO_2$ and since surface tension does not act on the supercritical-state $CO_2$, an atmosphere on the surface of the wafer W may be substituted from the liquid IPA to the supercritical-state $CO_2$ without causing the pattern collapse.

Herein, as described above, since internal chamber 32 has a size to house two wafers W, the volume thereof is relatively small. Therefore, in the state in which the temperature and pressure of the supercritical-state $CO_2$ are much higher than critical points, when $CO_2$ of an amount to anticipate a decrease in temperature or pressure by the expansion is supplied into processing space 310 in advance, the supercritical state of $CO_2$ may be sufficiently maintained. Further, for example, even though the IPA in internal chamber 32 is flowed out and the supercritical-state $CO_2$ is expanded, the power of heater 312 may be increased to maintain the supercritical state.

In such a manner, when the IPA in internal chamber 32 is discharged and the atmosphere in processing space 310 is all substituted with the supercritical-state $CO_2$, valve V3 of supplying and discharging line 524 is closed (see FIG. 9B), and valve V4 of exhaust line 531 is opened to depressurize processing space 310 up to the atmospheric pressure. As a result, although the supercritical-state $CO_2$ is changed to a gaseous state, no interface is formed between the supercritical state and gas. Therefore, the wafer W may be dried without applying the surface tension to the pattern formed on the surface (see FIG. 9C).

Herein, in an example shown in FIG. 9C, processing space 310 is depressurized by using exhaust line 531 exhausting an atmosphere in external chamber 31 at the time of supplying the liquid $CO_2$, but in order to prevent dusts from being wound up because the upward flow of $CO_2$ is formed in processing space 310 at the time of the depressurizing operation, for example, the depressurization may be performed while a downward flow is formed in processing space 310 by installing the exhaust line only for depressurization on the base of external chamber 31. Further, the depressurization may be performed using supplying and discharging line 524 connected to the bottom of internal chamber 32. In addition, at the time of depressurizing processing space 310, the internal temperature of processing space 310 may be increased by using heater 312 so as to prevent the IPA solved in the supercritical-state $CO_2$ from being condensed on the surface of the wafer W because the temperature in processing space 310 is decreased due to the expansion of $CO_2$.

By the process as described above, when the supercritical processing of the wafer W is terminated, fixation plate 34 is retreated up to a retreat location, and covering member 321 is moved to the front side to draw out internal chamber 32 up to the passing location. Fork 411 then enters internal chamber 32 to take out each one processed wafer W.

When the wafer W is taken out from internal chamber 32, a connection point of changeover valve 525 is switched to IPA supplying line 521 and solution sending mechanism 522 is actuated to supply the IPA from IPA storing unit 52 and in the state in which the IPA is filled in internal chamber 32, carry-in of the next wafer W is waited.

Meanwhile, the taken-out wafer W is transferred to first transfer mechanism 121 through carry-out rack 43 and housed in the FOUP 7 by passing through an opposite path to that in the carry-in of the wafer W, thereby completing a series of operations for the wafer W.

Supercritical processing apparatus 3 according to the exemplary embodiment of the present disclosure provides the following effects. Since the dry preventing liquid, IPA, in which the wafer W is immersed is substituted directly to the supercritical-state $CO_2$ to dry the wafer W, the surface of the wafer W is prevented from being natively dried until the processing using the supercritical-state $CO_2$ starts, thereby preventing the occurrence of the pattern collapse.

Further, in external chamber 31, since the wafer W in internal chamber 32 is kept in the longitudinal direction, for example, even in the case in which dusts such as particles attached to the wafer W are dispersed along the flow of the IPA or the supercritical-state $CO_2$, the surface of the wafer W is not disposed at a location where the dusts move down by gravity, and, as a result, it is difficult that recontamination of the wafer W occurs. In addition, as the IPA is substituted with the supercritical-state $CO_2$ toward the lower part from the upper part of internal chamber 32, the dusts dispersed from the wafer W are flowed toward opening 324 on the base of internal chamber 32 together with the IPA, and, as a result, the wound-up of the dust is suppressed to further prevent the dusts from being reattached to the wafer W.

Herein, in FIGS. 4 to 9, the example of the so-called dual case type supercritical processing apparatus 3 has been described in which the wafer W is immersed in the IPA filled in internal chamber 32, and internal chamber 32 is carried into external chamber 31 and thereafter, the supercritical processing is performed, but the supercritical processing apparatus to which the exemplary embodiment of the present disclosure can be applied is not limited thereto. For example, as shown in FIGS. 10A and 10B, a so-called single case type supercritical processing apparatus 3a in which the wafer W is kept in the longitudinal direction in the IPA supplied to external chamber 31 may be used.

Figure 10:
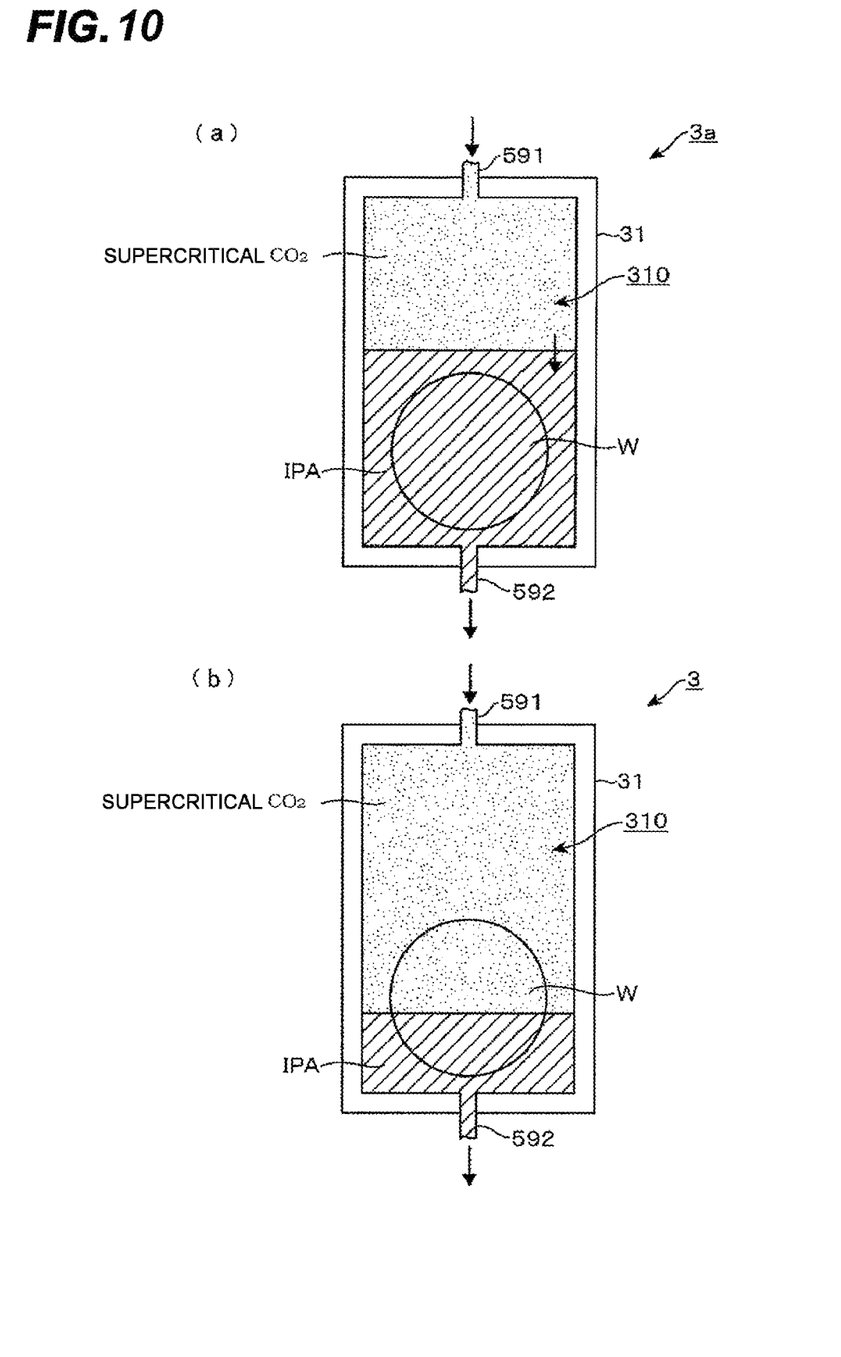
FIG. 10 is an explanation diagram showing a supercritical processing apparatus, according to another exemplary embodiment of the present disclosure.

In the example shown in FIGS. 10A and 10B, for example, a $CO_2$ storing unit (not shown) storing $CO_2$ in the liquid state or supercritical state is installed at the upstream side of a supercritical fluid supplying line 591, and the liquid $CO_2$ is changed to the supercritical state, or the supercritical state of the $CO_2$ is maintained by performing at least one of the heating and pressurizing of the fluid $CO_2$ to supply the fluid $CO_2$ to processing space 310 through supercritical fluid supplying line 591. As a result, the IPA in processing space 310 is discharged to supercritical fluid supplying line 591, and the IPA around the wafer W is substituted with the supercritical-state $CO_2$ toward the lower part from the upper part. In addition, when the substitution operation is terminated, the dried wafer W may be acquired by depressurizing external chamber 31.

Besides, in the case in which supercritical processing apparatus 3 is a dual case type, a moving mechanism moving internal chamber 32 between the inner part and the outer part of external chamber 31 is not installed but internal chamber 32 may be fixed to the inside of external chamber 31. Even in this case, a substitution fluid such as the liquid $CO_2$ is supplied to a space between the inner surface of external chamber 31 and the outer surface of internal chamber 32 to supply the substitution fluid which is not yet changed to the supercritical fluid to the inside of processing space 30 without being mixed with the IPA.

Further, although in the exemplary embodiments described above, the IPA is used as the liquid in which the wafer W is immersed and the $CO_2$ is used as the supercritical-state substitution fluid substituted with the liquid, the example of each fluid is not limited thereto. For example, instead of supplying the dry preventing IPA to the washed wafer W, the wafer W may be immersed in the DIW which is the rinse solution (washing solution), which may then be substituted with the supercritical fluid. Further, for example, in a case in which hydro fluoroether (HFE) is used as the supercritical fluid, the wafer W is disposed in external chamber 31 in the state in which the wafer W is immersed in the liquid HFE to substitute the liquid HFE with supercritical-state HFE. Further, the IPA may be used as the supercritical-state substitution fluid.

Figure 11:
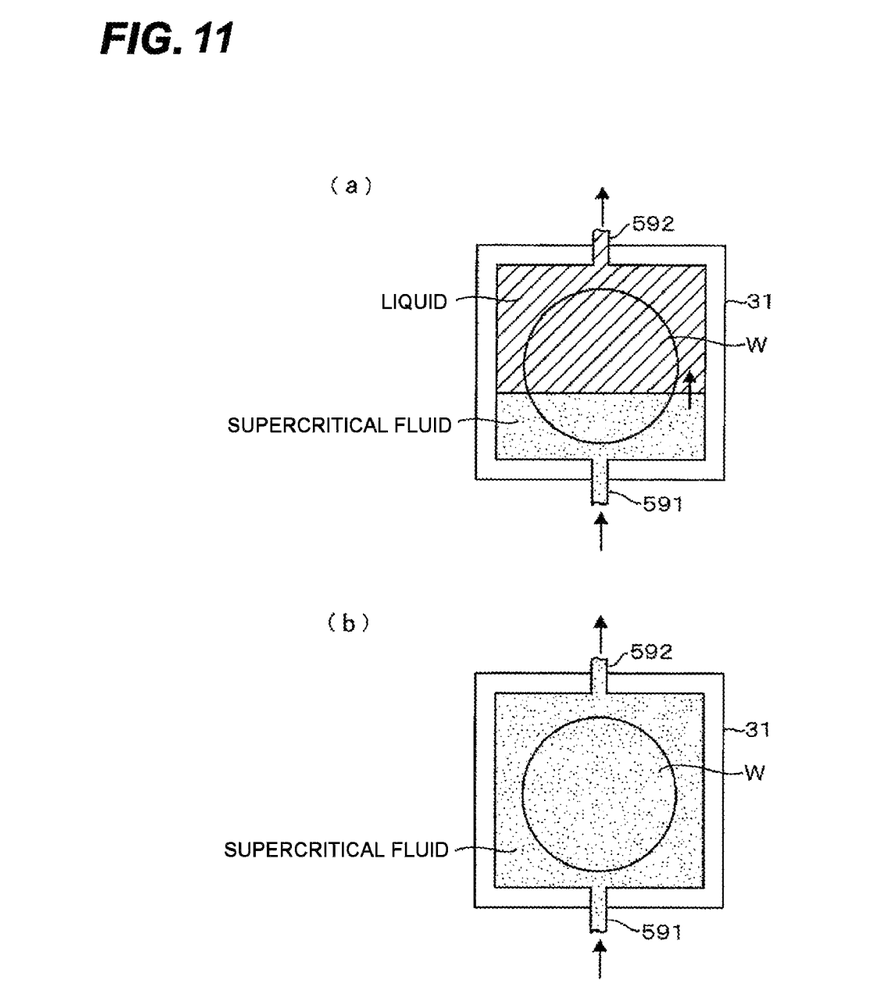
FIG. 11 is an explanation diagram showing a modified example of the supercritical processing apparatus, according to another exemplary embodiment of the present disclosure.

Further, even in the case in which the specific gravity of the liquid in which the wafer W is immersed is smaller than that of the supercritical-state fluid substituted therewith, the supercritical fluid is supplied from the lower part of external chamber 31 and may be substituted with the liquid toward the upper part like in a supercritical processing apparatus 3b shown in FIGS. 11A and 11B. Even in this case, since the wafer W is kept in the longitudinal direction, the wafer W may be dried while preventing the wound-up dusts from being reattached to the wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:

an external chamber including a processing space;

an internal chamber where a liquid in which a substrate to be processed is immersed is substituted with a substitution fluid of a supercritical state to dry the substrate, the internal chamber being configured to be inserted into the processing space of the external chamber via an opening in the front surface of the external chamber in a state where the substrate to be processed is immersed in the liquid of the internal chamber;

a traveling track configured to allow the transfer of the internal chamber into the external chamber, by carrying the internal chamber horizontally through the opening in the front surface of the external chamber;

a substrate holding unit provided on a bottom of the internal chamber and configured to hold the substrate in a vertical direction;

a substitution fluid supplying unit formed on a side surface of the external chamber and configured to supply the substitution fluid in a liquid state to the external chamber;

an energy supplying unit to change the substitution fluid from the liquid state to the supercritical state of the substitution fluid in the external chamber by performing at least heating of heating and pressurizing of the substitution fluid;

a liquid discharging unit formed on the bottom of the internal chamber and configured to substitute the liquid with the supercritical-state substitution fluid by discharging the liquid from the internal chamber; and an exhaust unit formed on a side of the external chamber and configured to depressurize the external chamber by discharging the supercritical-state substitution fluid subjected to substitution with the liquid from the external chamber and dry the substrate by changing the substitution fluid from the supercritical state to a gaseous state, wherein a top portion of the internal chamber is opened with an opening, and the substitution fluid supplying unit configured to supply the substitution fluid to a space between an inner surface of the external chamber and an outer surface of the internal chamber such that the substitution fluid is expanded to enter the internal chamber through the opening the top portion.

2. The substrate processing apparatus of claim 1, wherein the opening of the internal chamber includes a saw-like notch unit so that the supercritical fluid in the processing space will be uniformly introduced into the internal chamber.

* * * * *